United States Patent [19]

Sevenhans et al.

[11] Patent Number: 5,262,970
[45] Date of Patent: Nov. 16, 1993

[54] DIGITAL FILTER AND MULTI-CHANNEL DECIMATOR

[75] Inventors: Joannes M. J. Sevenhans, Brasschaat; Peter P. F. Reusens, Laarne; Lajos Kiss, Wilrijk, all of Belgium

[73] Assignee: Alcatel N.V., Netherlands

[21] Appl. No.: 760,770

[22] Filed: Sep. 16, 1991

[30] Foreign Application Priority Data

Sep. 18, 1990 [EP] European Pat. Off. ........ 90870154.3

[51] Int. Cl.⁵ .............................................. G06F 15/31
[52] U.S. Cl. ................................. 364/724.1; 364/724.13
[58] Field of Search ............... 364/715.01, 723, 724.01, 364/724.1, 724.16, 724.13; 341/155, 159

[56] References Cited

U.S. PATENT DOCUMENTS

| | | | |
|---|---|---|---|
| 4,323,980 | 4/1982 | Houdard et al. | 364/724.13 |
| 4,766,561 | 8/1988 | Thompson et al. | 364/724.13 |
| 4,775,851 | 10/1988 | Borth | 341/155 |
| 4,777,612 | 10/1988 | Tomimitsu | 364/724.16 |
| 4,881,191 | 11/1989 | Morton | 364/724.1 |
| 5,126,961 | 6/1992 | Garverick | 364/724.1 |

FOREIGN PATENT DOCUMENTS

WO90/13942 3/1990 PCT Int'l Appl. .

OTHER PUBLICATIONS

"A Bit-Slice Architecture for Sigma-Delta Analog-to-Digital Converters", Firedman et al., *IEEE Journal on Selected Areas in Communications*, vol. 6, No. 3, Apr. 1988, pp. 520–526.

"MOS ADC-Filter Combination That Does Not Require Precision Analog Components", M. Hauser et al., *IEEE International Solid-State Circuits Conference*, vol. 28, Feb. 1985, pp. 80–81 and 313.

*Primary Examiner*—Jerry Smith
*Assistant Examiner*—Chuong D. Ngo
*Attorney, Agent, or Firm*—Ware, Fressola, Van Der Sluys & Adolphson

[57] ABSTRACT

A multi-sample multi-channel digital decimator filter producing a Finite Impulse filtering Response (FIR) from 128 digital filter coefficients for 4 independent channels with a decimation ratio of 32, i.e. each from 1,024 kHz 1-bit inputs to 32 kHz multibit outputs, splits cyclically the coefficient values in 16 groups of 8, according to the coefficient positions, into 4 Read Only Memory modules (0, 1, 2, 3). The Read Only Memory modules are coupled to the 4 multipliers (MULT 0, 1, 2, 3), wherein the coefficient value is multiplied by that of the input bit, through a multiplexer (MUXI) being able to cycle through 4 distinct conditions. The 4 adder accumulators (ACC 0, 1, 2, 3) are coupled to the outputs of their respective channel multipliers. They each partially compute in parallel outputs words using one sixteenth of the coefficients and the multiplexer rotates these words, thereby enabling complete computation in 4 cycles. 4 registers (REG 00, 01, 02, 03) are associated to each adder so as to compute 4 staggered output words simultaneously for each channel. A preferred filtering response can reduce the size of the Read Only Memory modules.

22 Claims, 1 Drawing Sheet

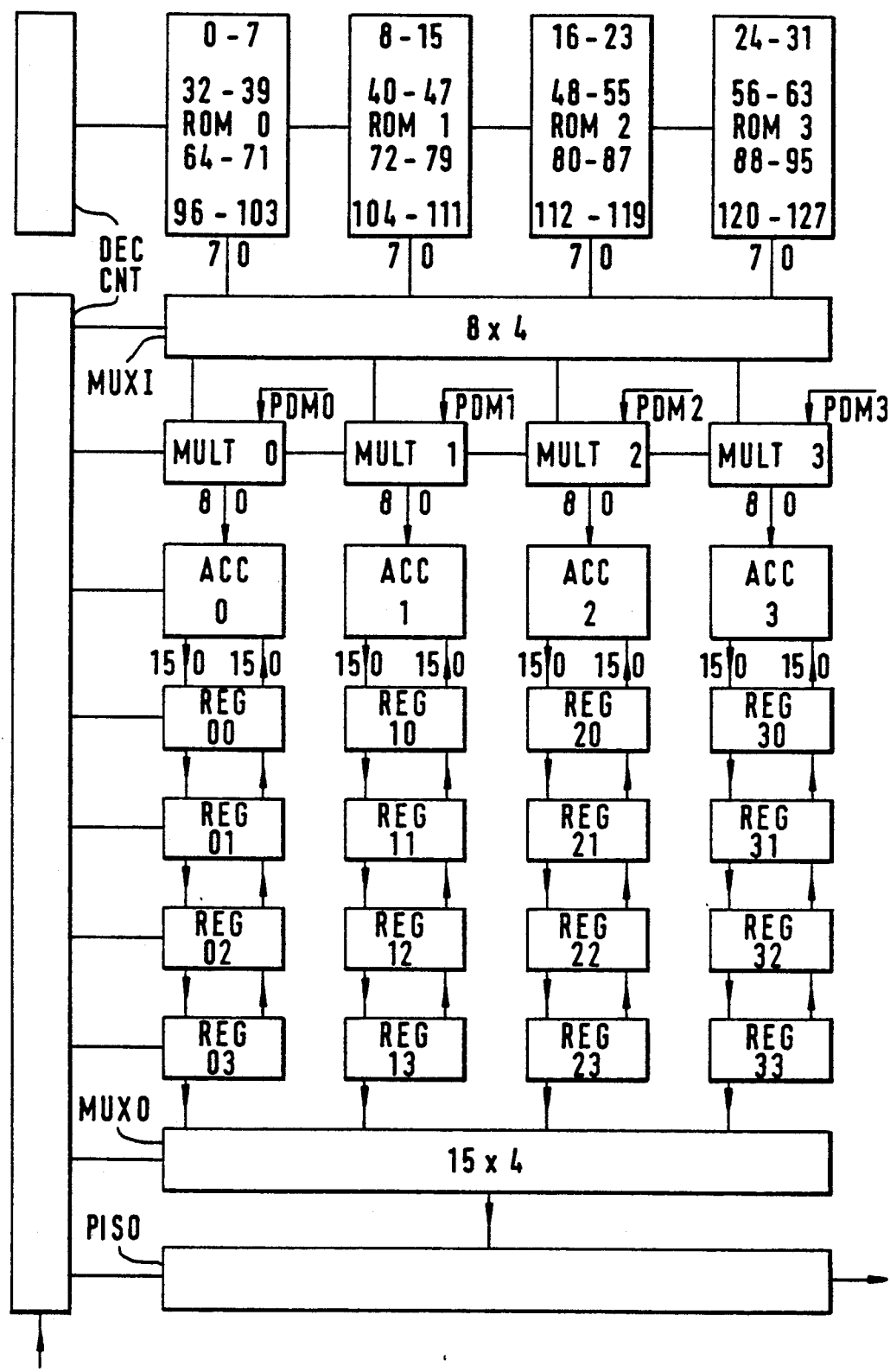

DIGITAL FILTER AND MULTI-CHANNEL DECIMATOR

BACKGROUND OF THE INVENTION

1. Field of the Invention

The invention relates to a digital filter which under the control of signals indicative of filter coefficients filters an input signal according to a predetermined characteristic which is a function of said coefficients, said coefficients being divided equally into at least three successive sections and with the coefficient numerical values exhibiting symmetry for those positioned equally on both sides of the middle in the overall coefficient sequence, the values being a function of the coefficients position within a section.

2. Description of the Prior Art

A multi-sample decimator using such a filter characteristic has been disclosed for instance, in the IEEE Journal on Selected Areas in Communication, Vol. 6, No 3, April 1988, p. 520 to 526, where it is part of the encoder section of a dual-channel sigma-delta voiceband Pulse Code Modulation codec. Fed from the output of an analog double loop sigma-delta modulator delivering digital signals in the form of 1-bit words at 1,024 kHz this digital decimator decreases the word rate of the 1-bit words to 18-bit words outputted at 16 kHz, thus with a decimation ratio N of 1024/16=64. This is achieved by a 192-point, i.e. 3N, Finite Impulse Response filter with zeroes at 16 kHz and at harmonic frequencies thereof the frequency response corresponding to a sinc cubic function as proposed by J. C. Candy in IEEE Transactions on Communications, Vol. COM-33, No 3, March 1985, p. 249 to 258 and particularly p. 255. Such a response was indicated in this last article to provide adequate noise attenuation for modulations generated by means of double integration and this contrary to a sinc square function. With N, the decimation ratio, as the number of input sample values or words occurring in one period NT of the resampling where T is the sampling period at the decimator input, the duration of the filter impulse response is 3NT whereby the multi-sample decimator has to keep track of 3 output samples computed in staggered fashion at the same time. As disclosed by Candy, this sinc cubic function can be secured by dividing the time sequence of 3N numerical coefficients into 3 successive sections of N coefficients. The first article mentioned above takes advantage of the sequence of the coefficients in each of the 3 sections to compute them in multiplex fashion using a parallel adder operating at 4 times the sampling frequency of the preceding sigma-delta modulator. This occurs with the help of 4 dynamic registers, one for the coefficients of each of the 3 sections and the fourth for a pointer to the previous value using increments between two successive coefficients which, for each of the 3 sections, are a corresponding linear function of the pointer. Thus, with the above decimation ratio N=64, the coefficients of the first section start with 0, 1, 3, 6, 10, ... while those of the third section end with the reverse sequence ..., 10, 6, 3, 1, 0 in view of the symmetry about the middle. The corresponding sequence of increments for the first section is the natural sequence of positive integers 1, 2, 3, 4, ..., e.g. for the 2nd to the 5th coefficient, while that for the third section is ..., −4, −3, −2, −1, e.g. for the 61th to the 64th coefficient, i.e. ..., 60-64, 61-64, 62-64, 63-64 showing the simple linear function consisting in subtracting 64 to obtain the successive decrements. On the other hand, in the second or middle section the linear function consists in subtracting twice the rank of the coefficient within that section from 64 whereby the first half will give decreasing increments and the second increasing decrements all doubled in size with respect to those of the first and third sections.

The circuit of the first article mentioned above permits a parallel adder to operate in multiplex to obtain the 3 coefficients simultaneously for a FIR filter structure that does not require full multipliers as the modulated input signal is a 1-bit code so that an AND operation is sufficient. Such circuitry and computation to obtain the coefficients is completed by a second decimation stage, the above digital FIR decimator filter for the first stage being followed by a digital Infinite Impulse Response bandpass filter outputting 13-bit words at 8 kHz to be subsequently converted into PCM signals at this last frequency but as compressed 8-bit signals. This final IIR decimation filter is needed, as also stressed by Candy, to remove such undesired signals at the output of the FIR filter as the residual quantization noise.

Contrary to the FIR design, that of the IIR is based on a parallel arithmetic unit, again including an adder, time-shared between several second order IIR filter sections and relying on numerical filter coefficients which this time are permanently stored in a Read Only Memory cooperating with a Randon Access Memory dealing with the state variables.

In another multi-sample FIR decimator, from 1 MHz to 32 KHz, disclosed in the IEEE Journal of Solid-State Circuits, Vol. SC-20, No 3, June 1985, p. 679 to 687, a rectangular window filter of length 64 having zeroes at 16 KHz and multiples thereof is followed by a second rectangular window filter of length 4 synthesizing zeroes at multiples of 256 kHz and finally by a 16-tap triangular window filter again creating zeroes at multiples of 16 KHz. This last part is based on triangular weights for the coefficients and shown in the IEEE Transactions on Communications, November 1976, p. 1268 to 1275, to minimize noise in nearly optimal fashion, the latter being provided by parabolic weights, i.e. with coefficients increments or decrements varying linearly, as in the first two articles referred to above, whereas they remain constant for the respective slopes with triangular weights. When combining these three windows the frequency response is no longer a sinc cubic function but it is the product of two sinc functions, corresponding to the rectangular windows, and of a sinc square function due to the triangular window. The corresponding z-transform is thus no longer $$(1-z^{}-N)^{}3(1-z^{}-1)^{}-3$$

where N remains, as above, the decimation ratio, but for the particular frequencies given above it can be expressed as $$(1-z^{}-64)(1-z^{}-4)^{}-1(1-z^{}-32)^{}2(1-z^{}-1)^{**}-2$$

When one expands the last z-transform response given above into a z power series to obtain the numerical coefficients, this produces only 123 non-zero coefficients, and not 128, the corresponding power series having $z^{}0=1$ as its first term and $z^{}-122$ as its last. Indeed, the sinc square part of the response gives as last term $z^{}(-62)$, i.e. the square of $z^{}(-32+1)$, while this will be $z^{**}-60$, with 60 obtained from ((64/4)−1)×4, for the remaining part. These 128 coefficients do not exhibit perfect symmetry with respect to the middle values. Indeed, starting from 1 for the 1st coefficient and proceding by groups of 4 successive equal coefficient increments, these (including the first or last groups provided one assumes it is respectively preceded or followed by 0) following the natural sequence of integers upward from 1 to 8, then downward back to 1, 0, −1 down to −8 and back to −1 for the increments, one has the following string of 123 non-zero coefficients: 1, 2, 3, 4, 6, 8, 10, 12, 15, ..., 254, 255, 256, 256, 256, 256, 256, 255, 254, ..., 15, 12, 10, 8, 6, 4, 3, 2, 1. The latter shows that if the value climbs from 1 to 256 and down to 0 again by identical half-strings of reversely ordered coefficients, these two half-strings of 61 coefficients each naturally do not cover the 64 coefficients from positions 0 to 63 and the 64 from 64 to 127, but 61 from 0 to 60 and 61 from 62 to 122. In other words, one of the five 256 coefficients in the "middle" is left in position 61 between the two half-strings and five zeroes remain for coefficient positions 123 to 127.

Accordingly, one does not have the symmetry found for the coefficients used in the first article mentioned above when they are positioned at equal distance from the middle of the sequence and even a split of the zeroes on both sides of the sequence could not bring this about in view of the odd number of non-zero coefficients.

SUMMARY OF THE INVENTION

One of the general objects of the invention is to realize a digital filter with numerical coefficients values chosen so that they can be obtained dynamically when needed or stored statically, each time with a minimum of means, while having an improved frequency response suitable for a multi-sample decimator using FIR filtering.

In accordance with a main feature of the invention, the coefficients are divided in four sections with the magnitudes of the increments between the values of successive coefficients in each section forming a sequence, which is identical for each of the four sections but with the order of the sequence for the second section being inversed, the sign of the sequence for the third section being inversed and both the order and the sign of the sequence for the fourth section being inversed, all three with respect to the sequence of increments of the first section.

In this manner, apart from an improved frequency response to be discussed later, one may, for instance, have a very simple monotonic sequence of increments, e.g. increments 1, 2, 3, ..., 30, 31 for 32 coefficients constituting the first section and decrements 31, 30, ..., 3, 2, 1 for those of the fourth, while increments 31, 30, ..., 3, 2, 1 are obtained for those of the second and decrements 1, 2, 3, ..., 30, 31 for those of the third. Additional symmetry can be obtained and exploited by positioning the sequences of N coefficients in each of the four sections so that the pairs of coefficients having the same rank inside the first and third sections, or inside the second and fourth sections, are linked by a unique function. When the decimation ration is a power of two, i.e. $N=2^{}k$ where k is a positive integer, with the advantage that gain adjustments are readily made by shifting the position of the bits without changing the multibit words, positioning such sequences of N coefficients in each of the four sections can also be carried out to avoid a largest value for the coefficients which is a power of two, e.g. $256=2^{}8$ for the design of the third article mentioned above. Instead, an efficient use of the number of bits used to define the coefficients can be achieved by having the largest coefficient value slightly below a power of two.

Such additional advantages of the present filter design can thus be materialized in having the $N=2^{}k$ coefficients of the first section defined by $n(n+1)/(2)+a$ where n takes all integer values from 0 to $(2^{}k)-1$ and a is 0 or a positive integer. With $a=0$, the coefficients of the first section would thus be 0, 1, 3, 6, 10, ..., $2^{}(2k-1)-2^{}(k-1)$, the last expression being the value of the Nth and largest coefficient of the first section, e.g. $512-16=496$ with $N=2^{}5=32$. This would be the same type of sequence of coefficients as for the first section in accordance with the first article referred to above, with the $N-1$ increments between successive coefficients being 1, 2, 3, 4, ..., 31. But with the present design, the unique function linking the coefficients having the same rank in the first and third sections could advantageously be a one's complement relation, i.e. the paired coefficients of the third section would be obtained by inverting ones into zeroes and vice-versa for the multibit coefficients of the first section. In particular, this would mean that the first and highest valued coefficient of the third section would be $2^{}(2k)-1$, e.g. 1023 or 10 one bits corresponding to a 0 value or 10 zero bits for the first coefficient in the first section.

Since the third section in accordance with the invention, as compared to the first, has exactly the same sequence of $N-1$ increments between its N coefficient values but as decrements since it is reversely ordered, its lowest valued coefficient would then be $$2^{}(2k)-1-2^{}(2k-1)+2^{}(k-1)=2^{}(2k-1)+-2^{**}(k-1)-1$$

With the coefficients of the third and fourth section being the same but reversely ordered with respect to those of the second and first in view of the symmetry about the middle position, the above value for the 3Nth coefficient is also that of the $(N+1)$th, i.e. the first of the second section, so that the increment between the $(N+1)$th and Nth coefficient, in the considered case of a one's complement relation, is $$2^{}(2k-1)+2^{}(k-1)-1-2^{}(2k-1)+2^{}(k-1)-=2^{**}(k-1)-1$$

or precisely the absolute value of the maximum increment/decrement within a section. For the example given, the coefficients of the first section thus end with ..., 435, 465, 496 and those of the second start with 527, 558, 588 showing the same increment of 31 three times in succession for the largest magnitude of the slope when considering the curve constituted by the overall sequence of coefficients.

The transition between the sections is slightly modified as compared to that for the sinc cubic sequence of the first above mentioned article where the increment between the $(N+1)$th and Nth coefficient is $2^{**}(k-1)$. But in the known arrangement, with only three sections, for the second and central one the increments then start to decrease at twice the unitary rate applicable to the first and third outer sections.

As compared thereto, with the decimator filter of the present invention, reaching a total of 4N instead of 3N coefficients, this central section is in effect expanded into two while its increments/decrements are reduced in half. But with the present four sections using the same sequence of increments for each of the four and positioned so that such a simple relation as one's complement can be used between coefficients of the first and third or of the second and fourth sections, storing the coefficients of only the first section into a ROM becomes a more attractive solution. Indeed, the coefficients from the third section can be obtained from the first by simple inversion of the bits, those of the fourth by addressing the $(N+1-n)$th coefficient within the section instead of the n th, and those of the second by using both measures. Likewise, obtaining the coefficients dynamically using a reversible binary counter (up and down) becomes also more attractive as the same counter can be used for all four sections to feed and adder/subtractor accumulator producing the coefficients from the counter generated increments/decrements, e.g. using two's complement for subtraction.

While the above is based on the N coefficients of the first section being defined by $n(n+1)/(2)+a$ where $a=0$, one can also use $a=1$ together with a two's complement instead of a one's complement relation, this leading also to the above advantages in obtaining the coefficients. Moreover, a two's complement operation, which consists in adding one after the bit inversion corresponding to a one's complement operation, is a classical way to deal with positive and negative multibit numbers, a sign bit added as Most Significant Bit being zero for the first and one for the second, e.g. $-1023$ as an 11-bit binary number, sign included, is 11111111111 and becomes 00000000001 or $+1$. Thus, with such a function linking coefficients of the same rank within the first and third sections, the latter can readily be secured from a multibit adder with carries between stages, and an input carry equal to one for the lowest stage, since the sum of the paired coefficient magnitudes is a power of two, i.e. $2^{}(2k)$. Instead of starting from 0 up to and including $2^{}(2k-1)-2^{}(k-1)$, e.g. 496 for $k=5$, adding 1 to all N, e.g. 32, coefficient values of the first section implies that the increment from the Nth coefficient, the last and largest of the first section, to the $(N+1)$th, the first and smallest of the second section, will now be $2^{}(k)-2$ whereas the last and largest increment in the first section and the first and largest increment in the second are both $2^{**}(k)-1$, e.g. ..., 29, 30, 31, 30, 31, 30, 29, ... with $k=5$. Hence, there is a small kink in the curve as the largest magnitude of its slope is now positioned around increments 30, 31, 30, 31, 30 instead of 30, 31, 31, 31, 30. But as will be explained later in discussing the filter response and the transfer function corresponding to such $4 \times 32 = 128$ coefficients as 1, 2, 4, 7, ..., 407, 436, 466, 497; 527, 558, 588, 617, ..., 1017, 1020, 1022, 1023; 1023, 1022, 1020, 1017, ..., 617, 588, 558, 527; 497, 466, 436, 407, ..., 7, 4, 2, 1 (a semi-colon separates the sections), an advantageous filter characteristic can be obtained. In particular, the absence of zero coefficients, i.e. as opposed to two in the sinc cube decimator of the first article mentioned above and five for the design of the third article, can lead to a more efficient filter in positioning the transmission zeroes.

This sequence of 128 non-zero coefficients has been obtained from a z-transform response to be further discussed later and which now multiplies a 64-point rectangular window with a 32-point sinc square as well as with an extra section defined by $1-z^{}(1)+z^{}(-2)$, such a combination now producing 1 for the 1st and for the 128th coefficients, this last in view of $(64-1)+2(32-1)+2=127$, the remaining values of the coefficients being those previously indicated above with 1023 as the maximum one for the two centrally positioned coefficients. Not only have such coefficients the advantages outlined above for their generation and use, e.g. a maximum value making the most effective use of the number of bits, but the frequency response is improved with respect to those of the above article.

While the first article mentioned above considered a multi-sample decimator to be used in a dual voice-band Pulse Code Modulation codec, and while time sharing of a multibit parallel adder was adopted for the computation of the decimator filter coefficients, nevertheless the device was realized with two identical halves for each channel, in a 1.5 micron CMOS technology, the semiconductor layout of one being the mirrored image of the other.

In the IEEE Journal of Solid-State Circuits, Vol. 23, No 6, December 1988, p. 1351 to 1357, a multi-channel oversampled PCM voice-band coder using a 3 micron CMOS technology was however disclosed and this uses a decimator which is time-shared over four channels. Therein the decimator was divided into a first stage including a FIR filter decimating from 1 bit at 4 MHz to 14 bits at 32 kHz followed by a second stage to obtain 20 bits at 8 kHz. The first stage is based on a triangular window having a length of 256, i.e. twice the decimation ratio of 4096/32, and with four adders, one for each channel, and with a single counter supplying the common sets of filter coefficients, one being the inverse of the other in view of the triangular impulse response, each adder having a set of associated registers. The second stage includes a FIR filter with 5 coefficients providing a 16 kHz output feeding an IIR elliptic filter of the 4th order, both being implemented with a microprogrammed architecture using a ROM for the program. Thus, although this second stage is multiplexed to serve the four channels and while the four adders of the first stage each operate in time multiplex fashion for their respective channels, a first stage multi-channel decimator particularly one dealing simultaneously with several samples due to its impulse response being wider than the decimator factor, able to deal with an arbitrary filter response is not disclosed since the latter would have to be stored into some general memory such as a ROM instead of using a counter.

Another general object of the invention is to realize a multi-channel decimator using a static storage means such as a ROM for the digital filter coefficient values.

In accordance with another main feature of the invention, a multi-channel decimator handling a plurality of p independent channels simultaneously, p being a positive integer, storage means for the digital filter coefficient values used in common for the p channels and coupled to adding means through multiplier means enabling the adding means to accumulate the products of a coefficient value by an associated channel input signal bit value as multibit output signals into corresponding registers associated to respective ones of the p channels and coupled to an output common to the p channels said storage means being divided into a plurality of at least p parts characterized in that said decimator filter further includes multi-condition switching means for simultaneously coupling each of p registers with a distinct part of the storage means, each distinct condition of the switching means enabling each of the registers to be coupled to a distinct part of the storage means.

In this manner, one may for instance have a multi-channel multi-sample decimator with p=4 multiplex adders and 4 multipliers, one for each of 4 channels and each adder dealing simultaneously with 4 samples in staggered fashion, there being a total of $4 \times 4 = 16$ registers. At any time there is a set of 4 registers, each associated with a different channel, which are coupled to the storage means for the filter coefficients, each of these 4 registers being coupled with a different section of the coefficients ROM memory each of which is therefore coupled to only one channel at a time It will be appreciated that the above specified means for the defined multi-channel decimator can be realized in a variety of ways. Any storage means best able to deal with only one channel at a time can be used advantageously. Several registers for each of the p channels can be used for multi-sample decimators whereby several output words can be computed concurrently, in staggered fashion, for each channel, using the same input signal bit values to compute the several output words in each channel. The adding means can either be individual per channel as previously disclosed, or a single multiplex adder working at higher speed can produce concurrently the output samples for all the channels.

If such a multi-channel multi-sample uses a 4-section digital filter as defined earlier, an especially efficient use of a ROM can be obtained as the latter can not only serve 4 channels simultaneously but could include two identical halves due to the general symmetry between the coefficient values of the first and second sections with those of the fourth and third. Moreover, three quarters of the total number of coefficients values, and not merely one half could be related to the values of the first section, either by being equal thereto when complementing the address for those of the fourth and/or by a simple unique relation, such as by inversion or by two's complementing of the bits, for those of the second and third. Such relations between the values could thus be exploited to reduce the size of the ROM.

DESCRIPTION OF THE DRAWINGS

The above mentioned and other objects and features of the invention will become more apparent and the invention itself will be best understood by referring to the following description of an embodiment taken in conjunction with the accompanying drawing representing a 4-channel FIR filter decimator, concurrently producing 4 samples per channel, in staggered fashion, including 16 RAM registers associated with a ROM simultaneously delivering 4 sections of N filter coefficients where N is the decimation ratio.

DESCRIPTION OF THE INVENTION

Before considering the various elements of the circuit shown, particularly the way in which the 4 parts of the ROM storing the filter coefficients are associated with the 16 channel registers REG storing q=4 samples for each of the p=4 independent channels, a preferred frequency response leading to particularly advantageous coefficient values will be further discussed. It is based on the already outlined transfer function $$(R64,1)(R32,1)^{}(2)(1-z^{}(-1)+z^{**}(-2))$$

where R64,1 and R32,1 are rectangular windows with 64 and 32 points respectively, e.g. $(-1))$ $$\begin{aligned} R64,1 &= (1 - z^{}(-64))(1 - z^{}(-1))^{}(-1) \\ &= 1 + z^{}(-1) + z^{}(-2) + \ldots + \\ &\quad z^{}(-62) + z^{**}(-63) \end{aligned}$$

with the second version being the expanded transversal form of the first recursive form giving the sum of the power series.

Hence, instead of R64,13 used in the first article mentioned above, or the three distinct rectangular windows, equivalent to R64,4 (R32,1)2, of the third article mentioned above, the present three (two forming a sinc square) are now combined with an extra FIR section producing transmission zeroes at+ and $-0.1666$ of the sample frequency, i.e. at 1024/6 kHz. With the remaining three window multiple transmission zeroes the overall response compared for example to that of the third article mentioned above, shows an improved low frequency performance at 128 kHz and the attenuation is larger particularly in the 128 to 320 kHz range where it is desired to attenuate noise peaks at 236 kHz created by the sigma-delta modulation.

The above response corresponds to the series of 128 filter coefficients with a pair of 1023 middle maximum values and previously indicated since they are the coefficients of the power series obtained by multiplying the various series which together constitute the overall expression, i.e.

$$1 + 2z^{}(-1) + 4z^{}(-2) + 7z^{}(-3) + \ldots \\ + 7z^{}(-124) + 4z^{}(-125) + 2z^{}(-126) + z^{**}(-127)$$

These particular coefficients offer special advantages in that, as previously highlighted, there are simple relations between the coefficients of the four sections with the result that once the coefficients of the first section are available, those of the second, third and fourth can be obtained therefrom without using the means to produce the coefficients of the first section.

Also, with the coefficients of the first section using a simple regular sequence of increments, 1, 2, 3, ..., 29, 30, 31, in this order and in the reverse one, i.e. decrements, using an adder with an accumulator can be an alternative to storing the coefficients in a ROM. Already with the latter, such an adder can be associated thereto when the increments are stored in the ROM instead of the actual coefficients. Indeed, a number of bits can be saved in this way since considering f.i. the above sequence of coefficient values with a range of the order of $2^{}10$, whereas this is $2^{}5$ for the increments, the economy is substantial.

Alternatively, ROM optimization via random logic is also a possibility. Not only can a reduction in the size of the ROM be obtained when the coefficient values in the second, third and fourth sections are related to those of like rank inside the first section, but further reductions can follow when the latter values of the first section show repetitiveness from one position to the next when expressed as binary numbers.

But in the case of the 4 sections of the filter initially characterized, storing the increments in a ROM so that the coefficients are obtained from an accumulator successively storing the coefficients when the increments extracted from the ROM are added to the previously accumulated value can also be replaced by a reversible (up/down) binary counter when the increments constitute such simple regular sequences as 1, 2, 3, 4, ..., 28, 29, 30, 31. Then, the counter can produce the increments dynamically, these being accumulated by the adder to obtain the actual coefficients. The counter would thus count in one direction for the first section, in the reverse one for the second, forward again for the third, but for decrements, and reversing again for the fourth, still for decrements, the latter being obtained f.i. by using the two's complement format.

Returning to the Figure however, the latter shows a general multi-channel multi-sample decimator embodiment adapted to store entirely arbitrary sequences of filter coefficient values in four associated ROM 0, 1, 2 and 3 and use them concurrently for 4 independent channels, each with its own adder accumulator ACC 0, 1, 2 and 3 to add successively those coefficient values for which the 1 MHz 1-bit input at PDM 0, 1, 2 and 3 is equal to 1 and to "add" a zero-word, in the two's complement format, when it is equal to 0. The general aim of such a 4-channel multi-sample decimator is to output each independent decimated channel as 22-bit Words at 32 kW/s in a 32 bit frame, using a linear code. These 4 independent decimated outputs are multiplexed on a single 4 MHz link with the help of such an output circuit as the PISO (Parallel In Serial Out) parallel/series converter.

As shown, ROM 0, 1, 2, 3 are controlled by an address decoder DEC itself driven by a counter and control unit CNT receiving synchronizing signals at its input. The highest clock frequency is a 4.096 MHz square wave with a half period of 1000/8.192=122 nanosecond for reading the filter coefficient values in the ROM and another for writing the result into the appropriate register out of the 16 registers, from REG 33 to REG 00, such as REG 23 used to store the results of the 4th section of filter coefficients (4th sample) for the 3rd channel.

Four successive periods of 244 nanosecond are used to read coefficients and to write results for the coefficients of like rank in the four sections and in each period simultaneously for the four channels so that all 16 registers are updated in about one microsecond. During this time, DEC produces a particular address out of 32, binary counters (not shown) in CNT being adapted to produce 4×32 corresponding time slots of about one microsecond as well as the above 4 slots of 244 nanoseconds. Thus, a first binary counter with two stages 0 and 1 can be driven at 4.096 MHz to define the 4 successive time slots of 244 nanoseconds by its 4 possible states, while a second binary counter with seven stages 2 to 8 can be driven at 4.096/4=1.024 MHz to define the 128 successive time slots of 4×244 nanoseconds by its 128 possible states. The complete cycle corresponds to 125 microsecond needed to compute a complete decimated output word with the 128 filter coefficient. Since 4 such words are concurrently and continuously computed in staggered fashion, for each channel, with shifts of 32, 64 and 96 coefficients with respect to the first word, the output word rate for each of the 4 channels is therefore 4(1000/125)=32 k bit/s.

As shown, each of ROM 0, 1, 2 and 3 stores one quarter of the 128 coefficients with their positions as indicated on the Figure so that, ROM 0 stores coefficients positions 0-7, with 8-15, 16-23 and 24-31 in ROM 1, 2 and 3 respectively, and again cyclically for the remaining coefficients positions with ROM 0 f.i. storing the 32 coefficients positions 0-7, 32-39, 64-71 and 96-103.

Accordingly, the 128 coefficient positions are divided into 16 sets of 8 consecutive positions and 4 sets are assigned cyclically to each of the 4 ROMs so that each ROM includes 4 sets with the above required shifts of 32, 64 and 96 positions enabling continuous outputs from each channel without any time distorsion. In this manner, to these shifts inside each of the 4 ROMs will correspond shifts of 8, 16 and 24 positions, as shown, when moving from ROM0 to ROM 1, 2 and 3 respectively.

To be stressed that this division of the 128 coefficients into the 4 ROMs is linked to a 4-channel multiplex decimator using a filter length which is 4 times the decimator ratio so that each input bit equal to one must be multiplied by 4 coefficient values. On the other hand, the particular division of filter coefficients into 4 sections of successive positions, as initially characterized, is concerned with the possibility of simplifying the obtention of the values of the coefficients positioned in the 2nd to the 4th sections from those of the first.

In what follows, unless otherwise specified, one will continue to describe the operation of the multi-channel multi-sample decimator in the general case where the 128 coefficient values can be entirely arbitrary although they should be stored, as shown, by 16 sets of 8 in accordance with their position.

These coefficients are indicated by 7-0 at the ROM outputs to be stored with 8 bits but, eventually, coefficients above the range 0 to 2**(8)-1=255 could be handled, e.g. by adding an extra clock generated 9th bit if a coefficient equal to 256 is also used as considered above.

As shown, these 8-bit output words from ROM 0, 1, 2, 3, or 8×4 bits in total, feed a multiplexer MUXI having 4 distinct states. Each of these lasts during 32 addressing periods of about 1 microsecond and corresponds to a particular cyclic distribution of the 4 inputs of 8-bit coefficients to the 4 outputs of 8-bit coefficients. In this manner, after each set of 32 addressing periods, as will be further explained below, for each of the 4 channels one of its 4 registers will have reached a final result equal to the summation of the filter coefficients corresponding to those out of the 128 for which the input data bit is equal to 1.

Just as CNT controls DEC for the addressing, it also controls MUXI in order to regularly step it through its four above conditions. Likewise, it also controls the four data multipliers MULT 0, 1, 2, 3 fed by the output of MUXI as well as by the data inputs PDM 0, 1, 2, 3 of the respective four independent channels. As mentioned above, such bits corresponding to voice channels coded at 1 MHz by a sigma-delta modulator will allow the 8-bit filter coefficient through to the corresponding channel adder/accumulator ACC 0, 1, 2 or 3 if the data bit is 1 and otherwise a 0 code will be fed to ACC 0, 1, 2, or 3 using the two's complement format. Thus, the 8-bit words at the input of MULT become 9-bit words at the output corresponding to the ACC input, as indicated by 8-0, since a sign bit is added (not shown) as 9th and Most Significant Bit.

In conventional manner, this leads to positive numbers starting with 0. On the other hand, negative numbers starting with 1 can be used to offset the decimator output, i.e. remove the DC component, as will be referred to below. This means that ACC 0, 1, 2, 3 can deal with positive or negative 15-bit numbers as indicated by 15-0 (16 bits including the sign) at the inputs and outputs of ACC leading to the respective REG.

As indicated, for each of the 4 channels, the 4 registers, e.g. REG 00, 01, 02, 03, associated thereto are fed in cascade with the ACC output and under the control of CNT. The register, e.g. REG 00, nearest to ACC acumulates the results obtained by multiplying the filter coefficient values of the first section by the input bits equal to one, and the next register in the chain, e.g. REG 01, accumulate those results corresponding to their respective sections as well as the result from the preceding register in the chain, e.g. REG 00, upon transfer from the latter.

In this manner, the 4th and last register, e.g. REG 03, in each chain of cascaded registers will thus be able to accumulate the final results comprised of the sum of the products of all 4×32=128 coefficients by those data bits equal to 1, i.e. the simple AND operation carried out by MULT.

As shown, the outputs from the fourth and last registers, e.g. REG 03, then feed the output multiplexer MUXO which, as indicated, can switch the 4 sets of 15 bits (plus a sign bit) to the 64 parallel inputs of the 15-bit PISO delivering its word serial output at 32 kHz, with the bits of each word in parallel, both MUXO and PISO being controlled by CNT.

The overall circuit having now been generally described, the sequence of the various operations can be seen from the following table with 6 columns and 128 rows, only 21 rows being explicitly shown in view of a cyclic process being involved. The first 2 columns define the address by the condition of MUXI (1 out of 4) and that of DEC (1 out of 32), e.g. 0/0 and 3/31 for the first and last rows shown, while the next 4 columns give the ROM address for channels 0, 1, 2 and 3 respectively, e.g. filter coefficient position 112 in ROM 2 for channel 2 in the fourth row and 103 in ROM 0 for channel 1 in the last one.

| MUXI | DEC | CHANNELS | | | |
|---|---|---|---|---|---|
| | | 0 | 1 | 2 | 3 |
| 0 | 0 | 0 | 8 | 16 | 24 |
| 0 | 1 | 32 | 40 | 48 | 56 |
| 0 | 2 | 64 | 72 | 80 | 88 |
| 0 | 3 | 96 | 104 | 112 | 120 |
| 0 | 12 | 3 | 11 | 19 | 27 |
| 0 | 13 | 35 | 43 | 51 | 59 |
| 0 | 14 | 67 | 75 | 83 | 91 |
| 0 | 15 | 99 | 107 | 115 | 123 |
| 0 | 17 | 36 | 44 | 52 | 60 |
| 0 | 21 | 37 | 45 | 53 | 61 |
| 0 | 25 | 38 | 46 | 54 | 62 |
| 0 | 28 | 7 | 15 | 23 | 31 |
| 0 | 29 | 39 | 47 | 55 | 63 |
| 0 | 30 | 71 | 79 | 87 | 95 |
| 0 | 31 | 103 | 111 | 119 | 127 |
| 1 | 0 | 8 | 16 | 24 | 0 |
| 1 | 31 | 111 | 119 | 127 | 103 |
| 2 | 0 | 16 | 24 | 0 | 8 |
| 2 | 31 | 119 | 127 | 103 | 111 |
| 3 | 0 | 24 | 0 | 8 | 16 |
| 3 | 31 | 127 | 103 | 111 | 119 |

Thus, the above table, with 21 lines explicitly shown out of the 128, 15 for MUXI=0 since only the first and last lines out of the 32 for MUXI=1, 2, 3 are shown in view of the repetitiveness, illustrates the full sequence of the 128 steps divided into 4 parts of 32 for each which MUXI is successively in conditions 0, 1, 2 and 3 as indicated in the first column. With MUXI in 0, the four ROM 0, 1, 2, 3, containing the filter coefficients positions indicated on the FIGURE, have their outputs directed to MULT 0, 1, 2, 3 respectively, i.e., channels 0, 1, 2, 3. With MUXI in 1, these outputs are cyclically shifted to MULT 3, 0, 1, 2, with MUXI in 2 to MULT 2, 3, 0, 1 and with MUXI in 3 to MULT 1, 2, 3, 0.

With each of the lines in the above table defined by the MUXI/DEC conditions of the first two columns, e.g. 0/0 for the first row, it is seen that sets of 4 successive lines follow in regular sequences such as 0/0, 1, 2, 3 and 0/12, 13, 14, 15 for the first 8 lines explicitly shown, there being a unit step in the ROM addresses of each of the 4 channels for every set of 4 lines, e.g. with 3 sets of 4 lines in passing from DEC=0 to 12, channel 0 now has its ROM address moving from 0 to 0+3=3, while, for DEC passing from 2 to 14, it moves from 80 to 83 for channel 2.

However, when MUXI changes its conditions, every 32 steps, the channels now obtain their filter coefficients from a different ROM 0, 1, 2, 3. Thus, 31 used by channel 3 according to line defined by 0/28 will be followed, 4 steps later, by 0 for that channel 3, as specified for line 1/0. This is because, starting with that line, channels 0, 1, 2, 3, i.e. MULT 0, 1, 2, 3, now receive their respective coefficients from ROM 3, 0, 1, 2 instead of ROM 0, 1, 2, 3 up to an including line 0/31. Accordingly, while MULT 0, 1, 2 will receive coefficients 8, 16, 24, whereas they had been receiving 7, 15, 23 four steps earlier, as defined by line 0/28, MULT 3 will obtain coefficient 0 instead of 31 four steps earlier. This is because 7, 15, 23, 31 are the last stored in ROM 0, 1, 2, 3 respectively so that with the switching of MUXI the next coefficients to reach MULT 0, 1, 2, 3 now come from ROM 1, 2, 3, 0 respectively as previously mentioned.

During each set of 4 successive conditions, starting with the line defined by 0/3, for each of the 4 channels the 4 successive cascaded registers, e.g. REG 03, 02, 01, 00 for channel 0, will be accessed under the control of CNT, first for reading during the first half period of the 4.096 MHz clock and for writing during the second, as previously mentioned. Thus, the 4 successive conditions of the 2 stages 0 and 1 of the first counter driven at 4.096 MHz will define which row of 4 registers will be simultaneously accessed, one for each channel, e.g. REG 00, 10, 20, 30 for condition 03 during which time coefficient positions 0, 8, 16, 24 will be respectively obtained, as indicated on the 1st line, for the computation involving the first quarter 0 to 31 of the coefficients. During these successive conditions of the first counter, the 4 rows of 4 registers will thus be involved in computations for their respective quarter of coefficients.

For such sets of 4 successive conditions, the 1.024 MHz input bits remain the same in their respective channels and the 7-stage counter with stages 2 to 8 and driven at this last frequency can provide for each of its 128 conditions not only the 4 coefficients stored in positions such as 0, 8, 16, 24 but simultaneously those in positions staggered by 32, 64 or 96. These additions to read 4 addresses in each ROM at the 1.024 MHz rate may be secured by reading appropriate phases of counter stages and in combination with the 2 stage outputs from the counter driven at 4.096 MHz and successively defining such simultaneously addressed positions as 0, 8, 16, 24.

For the condition indicated by the fourth line defined by 0/3, the maximum negative value is loaded into the first register in the chain for one channel, i.e. into REG 00 for channel 0, whereas this loading takes place into REG 10, 20, 30 for channels 1, 2, 3 respectively during the conditions defined by lines 1/3, 2/3 and 3/3. This offset to cancel the DC component, e.g. a value of $-2^{**}13 = -8192$ for a decimator output from $-8192$ to $+8192$, implies that only additions are needed. Other resulting advantages are that one always start from a predetermined reset value, that no overflow circuitry is necessary or circuitry to cancel initial values.

During the conditions defined by the last 4 lines, out of each successive 32 lines in the above table, the contents of the 4 registers for one particular channel out of the four will be successively shifted in the direction of the output, e.g. for 0/31, 30, 29, 28 this occurs for channel 3 with the contents of REG33, having now dealt with the 127th and last coefficient value, going to PISO through MUXO for 0/31, of REG32 to REG33 for 0/30, of REG31 to REG32 for 0/29 and of REG30 to REG31 for 0/28. Likewise, for 1/31, 30, 29, 28 the same four transfers will take place for channel 2, for 2/31, 30, 29, 28 for channel 1 and for 3/31, 30, 29, 28 for channel 0.

It will be noted that 0/29 corresponds to filter coefficient position 63 being obtained for channel 3, this storing the largest coefficient value 256, also obtained previously for 0/13, 17, 21, 25, i.e. positions 59, 60, 61, 62, and this if one assumes the previously indicated coefficient values sequence 1, 2, 3, 4, 6, 8, 10, 12, ..., 255, 256, 256, 256, 256, 256, 255, ..., 3, 2, 1, 0, 0, 0, 0, 0, which has the disadvantage of a highest value equal to a power of two. But since the counters can identify the conditions when such a value occurs, i.e, the lines just identified, an extra 9th bit for all ROM stored values can be avoided by generating a corresponding 1 value during the corresponding conditions.

Hence, the above described continuous and cyclic procedure implies that every 32 lines in the table corresponding to 8 steps of the counter driven at 1.024 MHz i.e. to a period of $(1000\times 8)/1024 = 7.812$ microseconds, 4 out of the 16 registers will have reached a partial count of 25, 50 or 75%, or a final count, enabling a shift of the information from one register to the next or, for that register out of the 4, e.g. REG 33, having reached a final count, to PISO through MUXO. For each channel, for 8 of the 32 lines, there will be access to the filter coefficients enabling multiplication by the corresponding PDM bit if equal to 1, e.g. coefficients in positions 120 to 127 in ROM 3 for channel 3 during conditions corresponding to lines 0/3, ..., 15, ..., 31. Accordingly, after 16 such periods of 7.812 microseconds during which each of 16 registers computes with 8 out of 128 coefficients, the 7-stage binary counter driven at 1.024 MHz has completed a full cycle involving 128 coefficients during which MUXI will have passed through 4 cycles of its 4 conditions to rotate the coefficients cyclically between the 4 channels to enable each of the latter to produce staggered output words starting every $(1000\times 8\times 4)/1024 = 31.25$ microsecond at 32 k bits/s.

Although the various lines in the above table are written in sets of four, starting with a line corresponding to the registers nearest to the adders and ending with a fourth line corresponding to the registers nearest to the output, the counter stepped at 4.096 MHz should start with this last set of registers so that the contents of the registers for a same channel can be shifted towards the output. In other words, after the counter driven at 1.024 MHz has made 8 steps during each of which 16 coefficient positions are simultaneously addressed, such a register as REG 33 on line 0/28 must first write its contents into MUXO then, corresponding to lines 0/29, 30, 31 registers REG 32, 31, 30 successively write into the registers REG 33, 32, 31 respectively.

Although the shown embodiment is a general one enabling multiplex decimator operations involving any desired filter response common for the independent channels, modification of the ROM stored coefficients enabling other responses to be produced, as noted previously, substantial simplification of the ROM can be achieved when using filter coefficients divided into 4 sections as initially disclosed in the present application.

While the principles of the invention have been described above in connection with specific apparatus, it is to be clearly understood that this description is made only by way of example and not as a limitation on the scope of the invention.

What is claimed is:

1. Digital filter having means for providing coefficients being divided equally into at least three successive sections and with coefficient numerical values exhibiting symmetry for those positioned equally on both sides of the middle in the overall coefficient sequence, the coefficient numerical values being a predetermined function of the coefficients position within a section, characterized in that the means for providing said coefficients divides said coefficients in four sections, each section containing the same number of coefficients with the magnitudes of the increments between the values of successive coefficients in each section forming a sequence, which is identical for each of the four sections but with the order of the sequence for the second section being reversed, the sign of the sequence for the third section being opposite, and both the order being reversed and the sign being opposite of the sequence for the fourth section, all three with respect to the sequence of increments of the first section, and means for combining the coefficients with a data input signal, for providing a multiplexed filtered output signal.

2. Digital filter as claimed in claim 1, characterized in that the coefficients are determined by a z-transform transfer function which is the product of a rectangular window with $2^{}(k+1)$ points by the square of a rectangular window with $2^{}k$ points, where k is a positive integer, and by a further polynomial in $z^{**}-1$.

3. Digital filter as claimed in claim 2, characterized in that k=5 and that the further polynomial is $1-z^{}(-1)+z^{}(-2)$.

4. Digital filter as claimed in claim 1, characterized in that the coefficients occupying like ranked positions in the first and third, or in the second and fourth sections, have their values linked by a unique function.

5. Digital filter as claimed in claim 4, characterized in that the unique function consists in the sum of the values of two linked coefficients being a unique predetermined linear function of the smallest power of two which is larger than the largest one of said coefficient value.

6. Digital filter as claimed in claim 4, characterized in that the differences between the values of two coefficients in adjacent positions in the first section is the sequence of the consecutive positive integers starting with unity.

7. Digital filter as claimed in claim 4, characterized in that the unique function consists in the sum of the values of two linked coefficients being a unique predetermined linear function of the smallest power of two which is larger than the largest one of said coefficient value, and the differences between the values of the two coefficients in adjacent positions in the first section is the sequence of the consecutive positive integers starting with unity.

8. Digital filter as claimed in claim 7, characterized in that the coefficient values are obtained statically from a memory storing only the coefficients of the first section, the coefficients of the third section being obtained by addressing the coefficient position of like rank in the first and taking the two's complement of the addressed coefficient value, the coefficients of the fourth section being obtained by addressing the coefficient of the first section occupying a position complementary to that sought in the fourth, and the coefficients of the second section being also obtained from the first by addressing the coefficient position of like rank in the first section and taking the two's complement of the addressed coefficient value, and by also addressing the coefficient of the first section occupying a position complementary to that sought in the fourth.

9. Digital filter as claimed in claim 1, characterized in that the values of successive coefficients in each section form a monotonic sequence.

10. Multi-channel decimator comprising:
four independent channels simultaneously, each having coefficient storage means (ROM 0, 1, 2, 3) for storing digital filter coefficient values used in common for the respective channels, and being coupled to adding means (ACC 0, 1, 2, 3) and multiplier means (MULT 0, 1, 2, 3) for accumulating the products of a coefficient value by an associated channel input signal bit value as multibit output signals into four corresponding registers (REG 00 to 33), which are coupled to a parallel to serial output (PISO) common to the respective channels, characterized in that
the storage means is divided into four sections, each section corresponding to one of the four independent channels, each section providing coefficients containing the same number of coefficients with the magnitudes of the increments between the values of successive coefficients in each section forming a sequence, which is identical for each of the four sections but with the order of the sequence for the second section being reversed the sign of the sequence for the third section being opposite, and both the order being reversed and the sign being opposite of the sequence for the fourth section, all three with respect to the sequence of increments of the first section, and
multiplexer switching means (MUXI) simultaneously couples each of the four corresponding registers with an associated one of the four independent channels, and each of the four corresponding registers (REG 00 to 33) is coupled to a respective one of the storage means (ROM 0, 1, 2, 3).

11. Multi-channel decimator as claimed in claim 10, characterized in that each of the four independent channels is filtered simultaneously.

12. Multi-channel decimator as claimed in claim 10, characterized in that a corresponding four registers are associated with each of the four independent channels, where four is the number of samples to be simultaneously handled in each channel, each of the four registers (REG 00, 01, 02, 03) for a channel being successively able to receive four multibit signals from the adding means (ACC 00 to 03) while a same signal input bit for the corresponding channel is coupled to the adding means (ACC 00 to 03) after being successively multiplied by four coefficients from the storage means (ROM 00 to 03).

13. Multi-channel decimator as claimed in claim 12, characterized in that the storage means are divided into a plurality of p equal parts.

14. Multi-channel decimator as claimed in claim 13, characterized in that each (ROM 0) of the p equal parts of the storage means is in turn divided into q equal sub-parts, each of the registers associated with a same channel being coupled in cascade and transferring its contents to the next register in the chain towards the common output after having dealt with all the successively positioned coefficients in p sub-parts each of which in a distinct one of the p parts, the last register in the chain delivering a decimated output signal to the common output for the corresponding channel.

15. Multi-channel decimator as claimed in claim 14, characterized in that the switching means multiplexes said coefficients after the contents of a first one of said cascaded registers of said corresponding channel has been transferred by said last register.

16. Multi-channel decimator as claimed in claim 15, characterized in that said decimator includes addressing means to address the storage means to extract coefficient values to be multiplied by input bit values, said addressing means being adapted to simultaneously address pq values, of like position in each of the pq sub-parts, during the time the q registers for each of the p channels are successively processing the output of the adding means.

17. Multi-channel decimator as claimed in claim 16, characterized in that the filter coefficient values determining the response of the decimator are sequentially stored by sets of r consecutive coefficient positions in each of the pq sub-parts where Y is a positive integer, a first, second, third and fourth set being stored in a first sub-part of a first, second, third and fourth part respectively, a fifth, sixth, seventh, eighth set being stored in a second sub-part of said first, second, third and fourth part respectively, and so on until all sets are stored.

18. Multi-channel decimator as claimed in claim 17, characterized in that r is a power of two.

19. Multi-channel decimator as claimed in claim 12, characterized in that q is a power of two.

20. Multi-sample decimator as claimed in claim 19, characterized in that p is equal to q.

21. Multi-channel digital filter as claimed in claim 10, characterized in that p is a power of two.

22. Digital filter as claimed in claim 10, characterized in that the values of successive coefficients in each section form a monotonic sequence.

* * * * *